(12) United States Patent
Lee

(10) Patent No.: US 11,005,066 B2
(45) Date of Patent: May 11, 2021

(54) ORGANIC ELECTRONIC DEVICE USING ADHESIVE FILM ENCAPSULATION TECHNOLOGY, AND METHOD OF MANUFACTURING SAME

(71) Applicant: Dongjin Semichem Co., Ltd., Incheon (KR)

(72) Inventor: Dong Hyun Lee, Gyeonggi-do (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 16/067,648

(22) PCT Filed: Dec. 29, 2016

(86) PCT No.: PCT/KR2016/015480
§ 371 (c)(1),
(2) Date: Jul. 2, 2018

(87) PCT Pub. No.: WO2017/116166
PCT Pub. Date: Jul. 6, 2017

(65) Prior Publication Data
US 2019/0006622 A1    Jan. 3, 2019

(30) Foreign Application Priority Data

Dec. 31, 2015    (KR) .................. 10-2015-0190895

(51) Int. Cl.
*H01L 51/52*    (2006.01)
*H01L 51/56*    (2006.01)
(Continued)

(52) U.S. Cl.
CPC ........ *H01L 51/5253* (2013.01); *H01L 21/764* (2013.01); *H01L 51/50* (2013.01);
(Continued)

(58) Field of Classification Search
CPC .................................................. H01L 51/525
See application file for complete search history.

(56) References Cited

U.S. PATENT DOCUMENTS

| | | | |
|---|---|---|---|
| 2007/0170846 A1* | 7/2007 | Choi | H01L 51/5246 313/504 |
| 2013/0213852 A1* | 8/2013 | Yamazaki | C03C 8/08 206/701 |

(Continued)

FOREIGN PATENT DOCUMENTS

| | | |
|---|---|---|
| JP | 2013069615 A | 4/2013 |
| JP | 2013073784 A | 4/2013 |

(Continued)

OTHER PUBLICATIONS

International Search Report for International Application No. PCT/KR2016/015480, dated Apr. 25, 2017, 4 pages.

(Continued)

*Primary Examiner* — Raj R Gupta
(74) *Attorney, Agent, or Firm* — Nelson Mullins Riley & Scarborough LLP; Kongsik Kim, Esq.

(57) ABSTRACT

This organic electronic device using an adhesive film encapsulation technology includes: a substrate; an electrode layer formed of a transparent conductive material on the top surface of the substrate; an active region layer which is an active layer that induces the flow of holes or electrons in a portion of the electrode layer; a counter electrode formed of a conductive material on the top surface of the electrode layer and the active region layer; an adhesive film attached to cover a region including the active region layer; and a cover material disposed at a certain distance vertically upward and apart from the adhesive film, and sealing the space between counter electrodes by using an encapsulating (Continued)

material along both edges thereof, wherein a gap is formed between the adhesive film and the cover material.

11 Claims, 3 Drawing Sheets

(51) Int. Cl.
    *H01L 21/764*     (2006.01)
    *H01L 51/50*     (2006.01)
    *H01L 51/00*     (2006.01)

(52) U.S. Cl.
    CPC ............ *H01L 51/52* (2013.01); *H01L 51/524* (2013.01); *H01L 51/5206* (2013.01); *H01L 51/5221* (2013.01); *H01L 51/56* (2013.01); *H01L 51/0003* (2013.01); *H01L 51/0021* (2013.01); *H01L 51/5012* (2013.01); *H01L 51/5056* (2013.01); *H01L 51/5072* (2013.01); *H01L 2251/558* (2013.01)

(56) References Cited

U.S. PATENT DOCUMENTS

| | | |
|---|---|---|
| 2013/0248891 A1 | 9/2013 | Kim et al. |
| 2015/0287940 A1* | 10/2015 | Yoo .................... H01L 51/5246 257/40 |
| 2015/0372251 A1 | 12/2015 | Fujii |

FOREIGN PATENT DOCUMENTS

| | | |
|---|---|---|
| WO | 2015-130588 A1 | 9/2015 |
| WO | 2015-166006 A1 | 11/2015 |

OTHER PUBLICATIONS

Supplementary European Search Report corresponding to European Patent Application No. 16882118.9 dated Jun. 25, 2019, 8 pages.

\* cited by examiner (Related Art)

ORGANIC ELECTRONIC DEVICE USING ADHESIVE FILM ENCAPSULATION TECHNOLOGY, AND METHOD OF MANUFACTURING SAME

CROSS-REFERENCES TO RELATED APPLICATIONS

This application is a U.S. national phase application, pursuant to 35 U.S.C. § 371, of PCT/KR2016/015480, filed on Dec. 29, 2016, designating the United States, which claims priority to Korean Application No. 10-2015-0190895, filed on Dec. 31, 2015. The entire contents of the aforementioned patent applications are incorporated herein by this reference.

TECHNICAL FIELD

The present invention relates to a method of manufacturing an organic electronic device, and particularly, an organic electronic device using adhesive film encapsulation technology by forming a gap between the adhesive film and the cover material and by preventing a thermal stress of an encapsulation material at a high temperature from being propagated into a nano-scaled organic device to improve high temperature stability of the organic device, and a method of manufacturing the same.

RELATED ART

An organic electronic device is a device including an organic material layer generating a charge flow by using holes or electrons.

Examples thereof may be a photovoltaic device, a rectifier, a transmitter, and an organic light emitting diode (OLED).

The organic light emitting diode (OLED) among the above organic electronic devices consumes less power, responds faster, and contributes to making a display device or a light thinner than a conventional light source. In addition, the OLED excellently utilizes a space and thus is expected to be applied in various fields covering all kinds of portable devices to monitors, laptops, and TVs.

In terms of commercialization and expansion of applications of OLEDs, durability is a very important factor. An organic material, a metal electrode, and the like included in an OLED are very easily oxidized by an external substance such as moisture and the like.

Accordingly, a product including an OLED is very sensitive to environment factors. Therefore, various methods of effectively blocking external permeation of oxygen, moisture, or the like into the organic electronic device such as an OLED and the like, for example, a method of using an adhesive film, have been suggested.

Since moisture or oxygen deteriorates luminous efficiency and a life-span of the organic electronic device, a sealing film should be formed under an atmosphere excluding moisture and oxygen in its manufacturing process.

FIG. 1 is a cross-sectional view showing a structure of an organic electronic device using an adhesive film encapsulation technology according to a conventional art.

The organic electronic device manufactured by applying the conventional adhesive film encapsulation technology includes a substrate 10 formed of glass or a film, an anode 11 sequentially formed on the top surface thereof by sputtering a metal or transparent conductive oxide, an active layer 12 formed by sequentially stacking an electron injection layer, an electron transport layer, a light emitting layer, a hole transport layer, and a hole injection layer on the anode 11, and a cathode electrode 14 formed on the anode 11 and the active layer 12.

Herein, an organic compound applied to the active layer 12 may be easily deteriorated by oxygen and moisture. Accordingly, in order to protect it from these oxygen and moisture, an adhesive film 13 is used to encapsulate the active layer 12 and the anode 11 formed on the active layer 12.

Glass 15 is formed on the encapsulated adhesive film 13, and the glass 15 and the cathode electrode 14 are encapsulated by an encapsulation material 16.

Since the adhesive film 13 performs the encapsulation through a junction of the organic compound, thermal stress may be generated due to inherent characteristics of the organic material under a high temperature condition.

Because of the thermal stress, the organic electronic device may propagate a tensile stress inside the electrodes 11 and 14 or the active layer 12. This tensile stress may have a very small size of hundreds of nano-units, but device characteristics are still deteriorated in a nanoscale device.

SUMMARY

In order to solve the problems, the purpose of the present invention is to provide an organic electronic device using adhesive film encapsulation technology providing improved high temperature stability of an organic device by forming a gap between the adhesive film and a cover material and by preventing a thermal stress at a high temperature from being propagated, resulting in improvement of high temperature stability of an organic device, and a method of manufacturing the same.

In order to solve the problems, an organic electronic device using an adhesive film encapsulation technology according to an aspect of the present invention includes: a substrate; an electrode layer formed of a transparent conductive material on the top surface of the substrate; an active region layer which is an active layer that induces the flow of holes or electrons in a portion of the electrode layer; a counter electrode formed of a conductive material on the top surface of the electrode layer and the active region layer; an adhesive film attached to cover a region including the active region layer; and a cover material disposed at a certain distance vertically upward and apart from the adhesive film, and sealing a space between counter electrodes by using an encapsulating material along both edges thereof, wherein a gap is formed between the adhesive film and the cover material.

An organic electronic device using an adhesive film encapsulation technology according to an aspect of the present invention includes: a substrate; an electrode layer formed of a transparent conductive material on the top surface of the substrate; an active region layer which is an active layer that induces the flow of holes or electrons in a portion of the electrode layer; a counter electrode formed of a conductive material on the top surface of the electrode layer and the active region layer; an adhesive film attached to cover a region including the active region layer; a sealing member formed to prevent adhesion on a portion of the top surface of the adhesive film and a portion of the top surface of the counter electrode; and a cover material formed on the top surface of the sealing member and sealing a space between counter electrodes by using an encapsulating material along both edges thereof.

A method of manufacturing an organic electronic device using an adhesive film encapsulation technology according to an aspect of the present invention includes: forming an electrode layer of a transparent conductive material on the top surface of a substrate; forming an active region layer which is an active layer that induces the flow of holes or electrons in a portion of the electrode layer; forming a counter electrode of a conductive material on the top surfaces of the electrode layer and the active region layer; adhering an adhesive film to cover a region including an active region layer; and disposing a cover material at a certain distance vertically upward and apart from the adhesive film and sealing the space between counter electrodes by using an encapsulating material along both edges thereof to form a gap between the adhesive film and the cover material.

A method of manufacturing an organic electronic device using an adhesive film encapsulation technology according to an aspect of the present invention includes: forming an electrode layer of a transparent conductive material on the top surface of a substrate; forming an active region layer which is an active layer that induces the flow of holes or electrons in a portion of the electrode layer; forming a counter electrode of a conductive material on the top surfaces of the electrode layer and the active region layer; adhering an adhesive film to cover a region including an active region layer; forming a sealing member acting as a dam to prevent adhesion on a portion of the top surface of the adhesive film and a portion of the top surface of the counter electrode; and forming a cover material on the top surface of the sealing member and sealing a space between counter electrodes by using an encapsulating material along both edges thereof.

The present invention has an effect of blocking propagation of a thermal stress at a high temperature and thus improving high temperature stability of an organic device by forming a gap between an adhesive film and a cover material according to the above structure.

The present invention has an effect of improving stability before and after an encapsulation process by forming the gap between the adhesive film and the cover material and charging an inert gas in the gap.

The present invention has an effect of securing reliability for mass production of the organic electronic device by forming the gap between the adhesive film and the cover material and thus improving high temperature stability of the organic electronic device.

DETAILED DESCRIPTION

Figure 1:
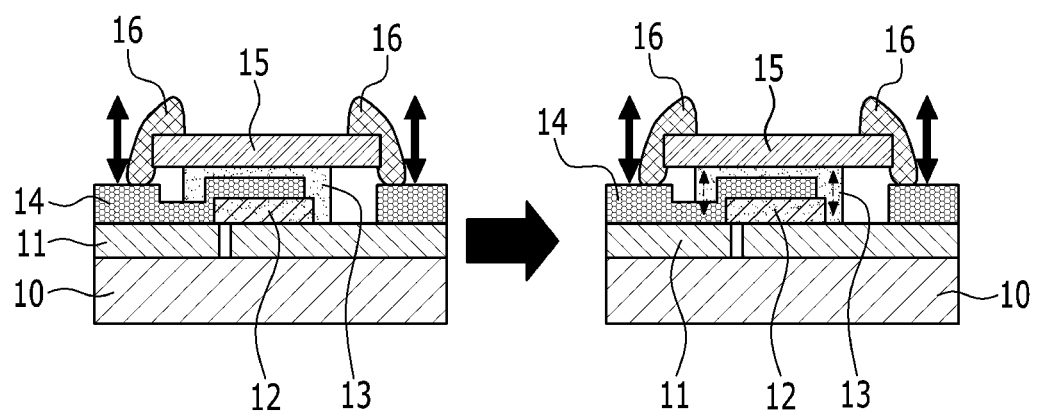
FIG. 1 is a cross-sectional view showing a structure of an organic electronic device using an adhesive film encapsulation technology according to a conventional art.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Through the specification, unless explicitly described to the contrary, the word "comprise" and variations such as "comprises" or "comprising" will be understood to imply the inclusion of stated elements but not the exclusion of any other elements.

Figure 2:
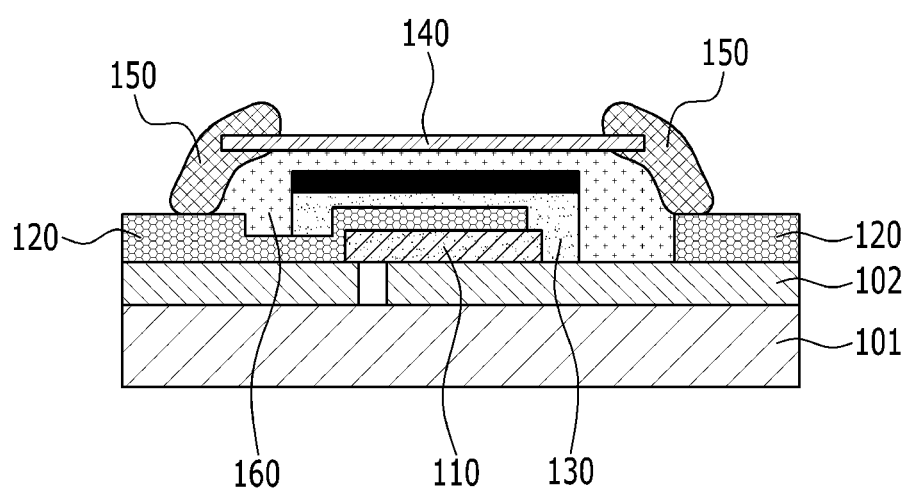
FIG. 2 is a cross-sectional view showing a structure of an organic electronic device using an adhesive film encapsulation technology according to an exemplary embodiment of the present invention.
Figure 3:
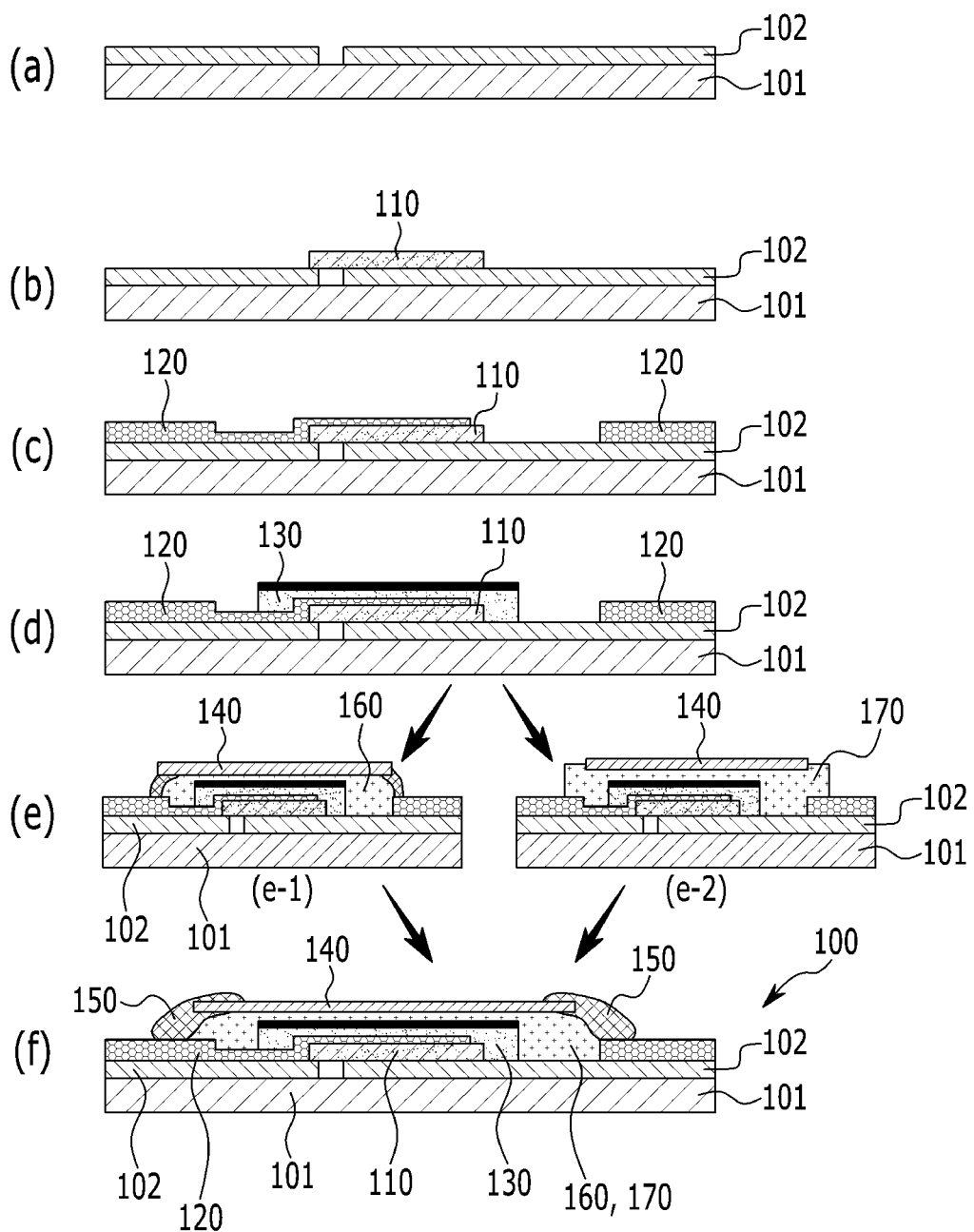
FIG. 3 is a view showing a method of manufacturing an organic electronic device using an adhesive film encapsulation technology according to an exemplary embodiment of the present invention.

FIG. 2 is a cross-sectional view showing a structure of an organic electronic device using an adhesive film encapsulation technology according to an exemplary embodiment of the present invention, and FIG. 3 is a view showing a method of manufacturing an organic electronic device using an adhesive film encapsulation technology according to an exemplary embodiment of the present invention.

An organic electronic device 100 using an adhesive film encapsulation technology according to an exemplary embodiment of the present invention includes a substrate 101, a transparent electrode 102, an active region layer 110, a counter electrode 120, an adhesive film 130, a cover material 140, a third encapsulation material 150, and a gap 160.

The substrate 101 may be formed of a transparent glass or plastic. Specific examples of the plastic may be polyethylene terephthalate (PET), polyethylene naphthalate (PEN), polycarbonate (PC), polypropylene (PP), polyimide (PI), triacetyl cellulose (TAC), and the like.

The transparent electrode 102 is formed on the top surface of the substrate 101 by sputtering or vacuum deposition ((a) of FIG. 3).

The transparent electrode 102 may consist of a transparent material such as indium tin oxide (ITO), fluorine tin oxide (FTO), antimony tin oxide (ATO), zinc oxide, tin oxide, $ZnOGa_2O_3$, $ZnO—Al_2O_3$, and the like as a TCO glass.

The nano-scaled active region layer 110 is formed on one top surface of the substrate 101 on which the transparent electrode 102 is formed ((b) of FIG. 3).

The active region layer 110 includes at least one layer of $TiO_2$ (an operation electrode) among an electron transport layer excited in perovskite, an active layer in which electrons are excited when it receives light, and a hole transport layer (HTM).

When the active region layer 110 is formed as a perovskite light absorption layer, the manufacturing process may include the following, but the present invention is not limited thereto.

A metal oxide paste of nanoparticles is prepared by mixing titanium dioxide ($TiO_2$) powder in ethanol as a solvent to obtain a colloid solution in which the metal oxide is dispersed.

The metal oxide paste is spin-coated on the transparent electrode 102 and sintered.

A perovskite solution is spin-coated on the TCO glass coated with the $TiO_2$ film. In other words, the perovskite light absorption layer is formed of a porous metal oxide on the top surface of each transparent electrode 102.

A method of preparing a perovskite-based dye is described in the prior art specification and will not be described in detail.

The hole transport layer may include a monomolecular hole transport material or a polymeric hole transport material, but is not limited thereto. For example, as the monomolecular hole transport material, spiro-MeOTAD [2,2',7,7'-tetrakis(N,N-p-dimethoxy-phenylamino)-9,9'-spirobifluorene] may be used, and as the polymeric hole transport material, P3HT [poly(3-hexylthiophene)] may be used, but are not limited thereto.

In addition, for example, the hole transport layer doping material uses a dopant selected from a Li-based dopant, a Co-based dopant, and a combination thereof as a doping material, but the present invention is not limited thereto. For example, the hole transport material may include a mixture of spiro-MeOTAD, tBP, and Li-TFSI, but is not limited thereto.

In addition, the active region layer 110 may include an electron transport layer formed of an electron transport material receiving electrons from the perovskite light absorption layer and then transporting them to the counter electrode 120.

The electron transport material may be [6,6]-phenyl-C61-butyric acid methyl ester (PCBM) of fullerene derivatives.

The electron transport layer may include PCBM as an example, but is not limited thereto, and may include any material capable of transporting electrons.

For example, the ETL may include a polymer such as PBD, TAZ, or spiro-PBD and a low molecular material such as Alq3, BAlq, or SAlq.

The active region layer 110 may include a hole injection layer, a light emitting layer, or an electron injection layer as an organic material layer.

The top surfaces of the transparent electrode 102 and the active region layer 110 are coated with the counter electrode material using a dispensing coating method or a screen printing method ((c) of FIG. 3).

The counter electrode 120 may use a conductive material, and specifically at least one material selected from platinum, ruthenium, palladium, iridium, rhodium (Rh), osmium (Os), carbon (C), $WO_3$, $TiO_2$, Au, Cu, Ag, In, Ru, Pd, Rh, Ir, graphene, and a conductive polymer in a form of a thin film or nanostructure.

The counter electrode 120 may be formed using vapor deposition (chemical vapor deposition, CVD), sputter deposition, thermal evaporation, dip coating, E-beam evaporation, atomic layer deposition (ALD), and the like.

The adhesive film 130 may have a thickness of 5 to 90 μm, and is transferred to cover a region including the active region layer 110. Specific examples of the adhesive film 130 may be a double-sided adhesive film, and specifically, a double-sided adhesive encapsulation film having light transmittance of 90% in a visible ray region. A method of applying the double-sided adhesive film is not particularly limited, but after peeling off a substrate or a release film from the double-sided adhesive film 130, the double-sided adhesive film may be transferred onto the counter electrode 120 including the active region layer 110 at room temperature or by applying heat thereto with a vacuum press, a vacuum laminator, or the like ((d) of FIG. 3).

When the double-sided adhesive film is cured at an excessively high temperature, a close-contacting force or an adhering force of the double-sided adhesive film may be deteriorated, and thus a process temperature may be adjusted within a range of 80 to 100° C. within 5 minutes.

The compressed adhesive film 130 may be additionally cured, for example, in a heat chamber or a UV chamber.

The cover material 140 as a second encapsulation material is disposed at a certain distance apart from the adhesive film 130, and seals the space between counter electrodes 120 along both edges thereof by forming a third encapsulation material 150 in a form of a barrier rib ((e-1) and (f) of FIG. 3). Herein, a gap 160 between the adhesive film 130 and the cover material 140 may have a space of 1 to 100 μm (when a gap layer has a minimum space of less than or equal to 1 μm, an encapsulation material thermally expanding within a temperature change of about 80° C. may propagate a stress into a device, and when a gap layer has a maximum space of greater than or equal to 100 μm, a device may be deteriorated due to an adhesive film having relatively low WVTR), and stability of the organic electronic device 100 may be secured by filling air or an inert gas in the gap.

This gap 160 blocks propagation of thermal stress at a high temperature, and improves high temperature stability of an organic material of the nano-scaled active region layer 110.

The cover material 140 as the second encapsulation material and the third encapsulation material 150 may be respectively formed of glass, a flexible polymer, or a resin having low water vapor transmission (WVTR).

According to another exemplary embodiment, (e-2) of FIG. 3 shows that a sealing member 170 is formed to play a role of a dam in order to prevent adhesion of the top surface of the adhesive film 130 to a part of the top surface of the counter electrode 120, and (f) of FIG. 3 shows that the cover material 140 as an encapsulation material is formed on the top surface of the sealing member 170 and seals a space between the electrodes 120 along both edges thereof.

The sealing member 170 may be formed of a material playing a role of a dam to prevent contact of the adhesive film 130 with the cover material 140, for example, various sealants, a multi-layered heat resistant tape, or the like, and specifically, has a coefficient of thermal stress of less than or equal to $10 \times 10^{-5}/°$ C.

The embodiments of the present invention described above are not implemented only by the apparatus and/or method, but may be implemented through a program for realizing the function corresponding to the configuration of the embodiment of the present invention, or a recording medium on which the program is recorded, and the present invention can be easily implemented by those skilled in the art from the description of the embodiments described above.

While the present invention has been particularly shown and described with reference to exemplary embodiments thereof, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: organic electronic device
101: substrate
102: transparent electrode
110: active region layer
120: counter electrode
130: adhesive film
140: cover material
150: third encapsulation material
160: gap
170: sealing member The present invention forms a gap between the adhesive film and the cover material according to the above structure, and thus has an effect of preventing propagation of thermal stress at a high temperature and improving high temperature stability of an organic device.

The present invention has an effect of improving stability before and after an encapsulation process by forming a gap between the adhesive film and the cover material and filling an inert gas in the gap.

The present invention has a further effect of securing reliability for mass production of an organic electronic device by forming the gap between the adhesive film and the cover material, and thus improves high temperature stability of an organic electronic device.

The invention claimed is:

1. An organic electronic device, comprising:
   a substrate;
   an electrode layer formed of a transparent conductive material on the top surface of the substrate;
   an active region layer which is an active layer that induces the flow of holes or electrons in a portion of the electrode layer;
   a counter electrode formed of a conductive material on the top surface of the electrode layer and the active region layer;
   an adhesive film attached directly to both the active region layer and the counter electrode to cover a region including the active region layer; and
   a cover material disposed at a certain distance vertically upward and apart from the adhesive film, and sealing the space between counter electrodes by using an encapsulating material along both edges thereof,
   wherein a gap is included between the adhesive film and the cover material,
   wherein the gap is 1 to 100 μm,
   wherein the gap is the distance vertically upward and apart from the adhesive film to the cover material, and
   wherein a thickness of the adhesive film is 5 to 90 μm.

2. The organic electronic device of claim 1, wherein the active region layer comprises at least one layer among an electron transport layer excited in perovskite, an active layer where electrons are excited when it receives light, and a hole transport layer.

3. The organic electronic device of claim 1, wherein the gap is filled with an inert gas.

4. The organic electronic device of claim 1, wherein the organic electronic device is used for a photovoltaic device, a rectifier, a transmitter, or an organic light emitting diode.

5. A method of manufacturing an organic electronic device, comprising:
   forming an electrode layer of a transparent conductive material on the top surface of a substrate;
   forming an active region layer which is an active layer that induces the flow of holes or electrons in a portion of the electrode layer;
   forming a counter electrode of a conductive material on the top surfaces of the electrode layer and the active region layer;
   adhering an adhesive film directly to both the active region layer and the counter electrode to cover a region including an active region layer; and
   disposing a cover material at a certain distance vertically upward and apart from the adhesive film and sealing the space between counter electrodes by using an encapsulating material along both edges thereof to form a gap between the adhesive film and the cover material,
   wherein the gap is 1 to 100 μm,
   wherein the gap is the distance vertically upward and apart from the adhesive film to the cover material, and
   wherein a thickness of the adhesive film is 5 to 90 μm.

6. The method of manufacturing an organic electronic device of claim 5, wherein the gap is filled with an inert gas.

7. An organic electronic device, comprising:
   a substrate;
   an electrode layer formed of a transparent conductive material on the top surface of the substrate;
   an active region layer which is an active layer that induces the flow of holes or electrons in a portion of the electrode layer;
   a counter electrode formed of a conductive material on the top surface of the electrode layer and the active region layer;
   an adhesive film attached directly to both the active region layer and the counter electrode to cover a region including the active region layer;
   a sealing member formed to prevent adhesion on a portion of the top surface of the adhesive film and a portion of the top surface of the counter electrode; and
   a cover material formed on the top surface of the sealing member and sealing the space between counter electrodes by using an encapsulating material along both edges thereof,
   wherein the gap is 1 to 100 μm,
   wherein the gap is the distance vertically upward and apart from the adhesive film to the cover material, and
   wherein a thickness of the adhesive film is 5 to 90 μm.

8. The organic electronic device of claim 7, wherein the active region layer comprises at least one layer among an electron transport layer excited in perovskite, an active layer where electrons are excited when it receives light, and a hole transport layer.

9. The organic electronic device of claim 7, wherein the sealing member is formed of a material for a sealant or a multi-layered heat resistant tape as a material playing a role of a dam blocking contact of the adhesive film with the cover material.

10. The organic electronic device of claim 7, wherein the organic electronic device is used for a photovoltaic device, a rectifier, a transmitter, or an organic light emitting diode.

11. A method of manufacturing an organic electronic device, comprising:
    forming an electrode layer of a transparent conductive material on the top surface of a substrate;
    forming an active region layer which is an active layer that induces the flow of holes or electrons in a portion of the electrode layer;
    forming a counter electrode of a conductive material on the top surfaces of the electrode layer and the active region layer;
    adhering an adhesive film directly to both the active region layer and the counter electrode to cover a region including an active region layer;
    forming a sealing member acting as a dam to prevent adhesion on a portion of the top surface of the adhesive film and a portion of the top surface of the counter electrode; and
    forming a cover material on the top surface of the sealing member and sealing the space between counter electrodes by using an encapsulating material along both edges thereof,
    wherein the gap is 1 to 100 μm,
    wherein the gap is the distance vertically upward and apart from the adhesive film to the cover material, and
    wherein a thickness of the adhesive film is 5 to 90 μm.

* * * * *